United States Patent [19]

Kakimoto

[11] Patent Number: 5,027,683
[45] Date of Patent: Jul. 2, 1991

[54] PUNCHING DEVICE FOR THIN PLATES AND PUNCHING UNITS USED WITH PUNCHING DEVICE

[75] Inventor: Masakazu Kakimoto, Aichi, Japan

[73] Assignee: Ushio Kogyo Co., Ltd., Aichi, Japan

[21] Appl. No.: 177,930

[22] Filed: Apr. 5, 1988

[30] Foreign Application Priority Data

Apr. 24, 1987 [JP] Japan ............................. 62-102198

[51] Int. Cl.⁵ ............................ B26D 5/30; B26F 1/04
[52] U.S. Cl. ....................................... 83/76.6; 83/521;
83/549; 83/551; 83/571; 83/639.1; 72/444
[58] Field of Search ................ 83/76.6, 549, 550, 551,
83/520, 521, 571, 639.1, 639.5, 685, 686, 690,
694, 76.1, 76.9, 405; 72/444, 481

[56] References Cited

U.S. PATENT DOCUMENTS

| | | | |
|---|---|---|---|
| 3,368,439 | 2/1968 | Bungay | 83/521 X |
| 3,717,059 | 2/1973 | Daniels | 83/552 X |
| 3,768,351 | 10/1973 | Stepan | 83/521 X |
| 4,220,062 | 9/1980 | Blanz | 83/76.6 |

Primary Examiner—Frank T. Yost
Assistant Examiner—Eugenia A. Jones
Attorney, Agent, or Firm—Sandler, Greenblum & Bernstein

[57] ABSTRACT

A punching device is provided which includes a plurality of punching units arranged in a side-by-side fashion on a substantially horizontal working surface. The device includes a plurality of punches and dies of different shaped, and a moving assembly, for supporting a holder frame, which moves a workpiece along both X- and Y-axes on a working table. A control unit is provided for inputting punching positions on the workpiece as well as the shape(s) of the holes to be punched, as well as for controlling operation of the moving assembly and punching units in response to inputted data, and for moving the punching positions of the workpiece below the desired punching units to perform punching operations. The punching units each comprises a substantially -shaped supporting member in which a piston is provided for moving a punch upwardly and downwardly. The punch is provided in one arm of the -shaped support member, with a corresponding die in a lower portion of the support member.

31 Claims, 6 Drawing Sheets

PUNCHING DEVICE FOR THIN PLATES AND PUNCHING UNITS USED WITH PUNCHING DEVICE

BACKGROUND OF THE DISCLOSURE

1. Field of the Invention

The present invention generally relates to a punching device for punching out pieces from thin plate material and to a punching unit in which the punching device is positioned.

2. Discussion of Relevant Information

Conventional punching devices used for punching holes having round, rectangular or ovular shapes exist for making the holes in desired locations in thin plate material, e.g., in circuit boards, flexible films, or metallic foil; in these devices, a plurality of punching units with punches are used to punch holes of desired shapes and are positioned immediately above each of the punching positions on a working surface on which the thin plate-like workpieces are respectively positioned.

In order to punch thin plate material with such punching devices, the punches in each of the punching units are simultaneously moved downwardly to effect a punching operation after respective workpieces are mounted on the working surface, and, thereafter, holes of desired shapes are punched at desired positions on the workpiece.

However, since punching devices as described above are formed such that each of the punching units is fixed immediately above the punching position of each workpiece, it is necessary to remove and replace each of the punching units with a new one in order to change the shape of the holes to be punched, or the punching position of the punching units, and thus a time loss caused by replacement of one punching unit would substantially decrease the overall working efficiency of the apparatus.

Furthermore, since punches in the punching units used in these punching devices cannot be replaced within a short period of time, it has been necessary to effect complete replacement of the punching units themselves, even in situations in which only the punch itself needs to be replaced with a punch of different shape.

SUMMARY OF THE INVENTION

Accordingly, it is a general object of the present invention to provide a punching device which is capable of easily accommodating modification of the shape(s) of the holes to be punched and/or changes in the punching position(s) of the respective punches.

Another object of the present invention is to provide an apparatus in which a punch installed in a punching unit is capable of being easily replaced.

In order to resolve the above-noted technical problems in previous constructions, the present invention provides a plurality of punching units which are arranged in a side-by-side fashion on a working table with punches and dies of different shapes being installed thereon. The apparatus further comprises a moving system for supporting at least one holder frame which holds a thin plate-like workpiece, which system moves the holder frames along both X-axis and Y-axis directions on a working table, and a control assembly for inputting data relating to the desired punching positions of the workpiece and the shape of the punches, for controlling operation of the moving system and the punching units in response to the data inputted, and for moving the workpiece into a punching position which is just below the location of a given punching unit.

A second portion of the present invention resolves some of the above-noted technical problems by using a lifting mechanism with a lifting piston which is movably arranged on the upper side of a substantially -shaped supporting member or rod. Further, a punch which is fitted within a fixing hole at one end of the upper portion of the supporting member is positioned such that the punch can be lifted or pulled, so that a lifting piston will be removably connected to a rear (i.e., upper) end of the punch, and so that a die which corresponds to the punch will be removably attached to the lower side portion of the supporting member.

In accordance with a first feature of the present invention, a control unit can be used to control operation of all of the moving mechanisms and each of the punching units in response to one or more inputted punching positions and the shape or shapes of the punches or holes to be made.

The moving mechanisms can, under the control of the noted control unit, sequentially move the position of the workpiece which is to be punched into locations which as just below a punching unit to which a punch of desired shape is attached, while the holder frame which holds the workpiece is moved rearwardly (or otherwise) along the working table surface in an X-axis direction and in a Y-axis direction. A selected punching unit can then lower a punch of a desired configuration when the punching position of the workpiece is moved just below such punch in order to punch a hole in a plate or workpiece at a desired punching position.

In accordance with a second feature of the present invention, as the lifting piston descends, a punch connected to the lifting piston will also descend while it is supported within a fixing hole in the support member in order to punch out the portion of the workpiece which is mounted on the die with an edge of the punch. Thereafter, the lifting piston will be lifted and the punch will also be lifted.

After being released from its connection with the lifting piston, the punch may be pulled upwardly within the fixing hole when the lifting mechanism is moved rearwardly along the upper side of the support; and, additionally, the punch can be installed by movement in an opposite direction.

The die is removably supported with respect to the lower side of the supporting frame.

Because of this construction, apparatus in accordance with the present invention has the effects noted directly hereinafter. It is possible to instantaneously effect successive punching operations, even when the work to be punched, has different punching positions or different settings of holes to be carried out. This is achieved by inputting data relating to the punching positions and the shape(s) of the punches in a plurality of punching operations via a control system. It is thereby possible to eliminate the labor and time loss which are involved in replacing the work in punching units which are required in prior art punching devices.

Additionally, since holes having the same shape to be punched in the workpiece are to be punched sequentially with one punching unit, merely individually setting the punching units so as to provide punches of desired shape(s) permits all of the desired punching operations to be performed, thereby minimizing the number of punching units which are needed.

Since the second feature of the invention provides a construction in which punches and dies are arranged so that they can be easily removed, via a simple operation, replacement of both the punches and dies can be effected in a relatively short period of time, and repair and maintenance work can be freely and easily performed as well.

In a first aspect, the present invention provides a device for punching a thin plate-like workpiece, the device comprising a plurality of punching units arranged in a side-by-side fashion on a working table, with each of the punching units having a punch and a die of a predetermined shape. The device further comprises a moving assembly for movably supporting at least one frame which is adapted to hold the thin plate-like workpiece, with the moving assembly comprising means for moving the holder frame in both X-axis and Y-axis directions along a surface of the working table. The device further comprises a control unit for inputting a punching position and punching shape data, and for controlling operation of the moving assemblies and the punching units in response to the data, the control unit further comprising means for moving a workpiece into desired punching positions below the punching units.

In another aspect, the present invention provides a punching unit which is adapted for use in a punching device having a lifting assembly. The lifting assembly includes a movably positioned lifting piston attached to one side of a substantially -shaped supporting member, with the supporting member further comprising at least one attaching hole and a punch detachably fitted within each of the attaching holes. The unit further comprises means for lifting and lowering the punch, the punch including a front end and a rear end, the rear punch end being detachably connected to the lifting piston, the punching unit further comprising a die corresponding to each one of the punches, each of the dies being detachably positioned within a lower portion of the supporting member.

In another aspect of the present case, a punching device for punching at least one hole in a thin, substantially flat workpiece is provided. The punching device comprises a substantially horizontal working table upon which a workpiece to be punched is adapted to be movably positioned; at least one holder frame for movably holding the workpiece on an upper surface of the table; a moving assembly for moving each holder frame in both an X-axis direction and a Y-axis direction along an upper surface of the table; at least one punching unit for punching holes in the workpiece, each punching unit comprising a punch and a die; and a control unit for inputting data representative of desired punching locations on the workpiece and of the shape of each punch to be made, the control unit comprising means for controlling the operation of the moving assembly and of the punching unit in response to any data which is inputted.

The control unit further comprises means for controlling movement of the assembly to position the workpiece at a plurality of predetermined positions which are to be punched, each punching unit comprising means for punching the workpiece at each of the predetermined positions.

The working table is substantially flat, and is positioned in a horizontal fashion on a base table. The punching device includes a plurality of adjacent punching units aligned on the working table, each of the punching units having a punch and a die of a predetermined shape, wherein the punches of each of the punching units have different shapes.

Each of the punching units comprises a generally -shaped supporting member having an upper portion and a lower portion, with a punch being positioned in the upper portion of each of the supporting members and a die being positioned in the lower portion of each of the supporting members. The punches in the punching units are aligned in a substantially linear fashion.

Each of the holder frames has a window, wherein the workpiece, when positioned in the holder frame, is visible through the window; and each holder frame includes at least one clamp for detachably retaining a workpiece within the frame.

The moving assembly comprises a lateral feeding mechanism for moving each of the frames in a substantially X-axis direction along the upper table surface and a longitudinal feeding mechanism for supporting the lateral feeding mechanism and for moving the lateral feeding mechanism in a substantially Y-axis direction along the upper table surface. The lateral feeding table includes a threaded rotatable screw which is driven by a first motor, the screw being positioned within a threaded aperture in a clamping member which engages the frame; and the longitudinal feeding mechanism comprises a threaded screw which is driven by a second motor, and a plurality of clamps which engage an outer surface of the lateral feeding mechanism.

Both of the motors can be controlled by the control unit, with the control unit preferably comprising a microprocessor. The punching device further comprises a microscope aligned with, and offset from, each the punching unit, the microscope comprising means for determining positions on the workpiece which are to be punched.

In yet another aspect of the present invention, a method of punching a plurality of holes in desired positions on a workpiece is provided, with each of the holes having a desired shape. The method comprises inputting data into a control unit, the data relating to a plurality of desired positions at which the holes are to be punched, and the shapes of the holes to be punched; sequentially moving the workpiece to the plurality of desired workpiece positions; and punching a hole, at each of the desired workpiece positions, such that each said hole will have a shape which has been input into the control unit.

The punching positions to be input are determined by moving the workpiece along both X-axis and Y-axis directions of a horizontal surface, and by causing each of the plurality of desired punching positions to be inputted into the control unit when each of the punching positions is sequentially aligned with a viewing instrument. Each of the punching positions is sequentially aligned with a center of a microscope; and the method further comprises precisely positioning the workpiece within a moveable holder frame. The holes are punched by sequentially moving the workpiece to desired punching positions, and by punching a shaped-hole with a shaped punch at each of the positions.

In a further aspect of the present invention, a punching unit is adapted to be used with a punching device for punching a plurality of holes of predetermined shapes in a workpiece. The punching unit comprises a generally -shaped support member having an upper surface and a lower surface; a lifting assembly detachably positioned on the upper surface of the support member; a punch of a predetermined shape movably positioned within an attachment hole in an upper portion of the support member, the punch having a front end and a rear end; means for detachably connecting the rear end of the punch to the lifting assembly; and a die having a shape complementary to the punch shape, the die being removably positioned within a lower portion of the support member.

The support member comprises a steel plate having a predetermined thickness, and the punching unit further comprises a dovetail-shaped fastening member positioned on an upper surface of the support member, the fastening member being fitted within a groove on a lower surface of the lifting assembly.

The supporting member further comprising a substantially longitudinal bore, the punching unit further comprising a cam shaft fitted within the longitudinal bore and a locking element movably positioned in the bore, the locking element being moveable into a locked position in which it protrudes through an opening in the fastening member and extends into the groove.

The punch lifting assembly includes a punch lifting piston assembly which is connected to the upper surface of the support member and which comprises means for raising and lowering the punch within the attachment hole. The lifting piston assembly comprises a lifting piston, a lowering piston, and a shaft connecting the two pistons, each of the pistons being fitted into a separate cylinder. The unit further comprises means for selectively supplying compressed air to, and removing compressed air from, the cylinders.

The attachment hole has a substantially cylindrical bearing fitted therein, wherein the punch is fitted within the bearing such that a predetermined clearance is located between the punch and the bearing. The punching unit further comprises means for supplying compressed air to the clearance.

The punching unit further comprises a connector plate attached to the rear end of the punch, and a guide shaft positioned in a bore in the support, the guide shaft having one end engaged by the connector plate, the connector plate thereby comprising means for maintaining the punch and the guide shaft in a substantially horizontally spaced position. A locking mechanism is provided for maintaining the die within a bore in the lower portion of the support member; and the locking mechanism comprises two arm plates pivotably supported by a support shaft which detachably supports the die, with each of the arm plates having a first end which is adapted to engage a rotatable cam shaft.

BRIEF DESCRIPTION OF THE DRAWINGS

The above and other objects, features and advantages of the present invention will now be hereinafter described with respect to the accompanying drawings, in which like reference numerals represent similar parts throughout the several views, and wherein.

DETAILED DESCRIPTION OF THE DRAWINGS

Figure 1:
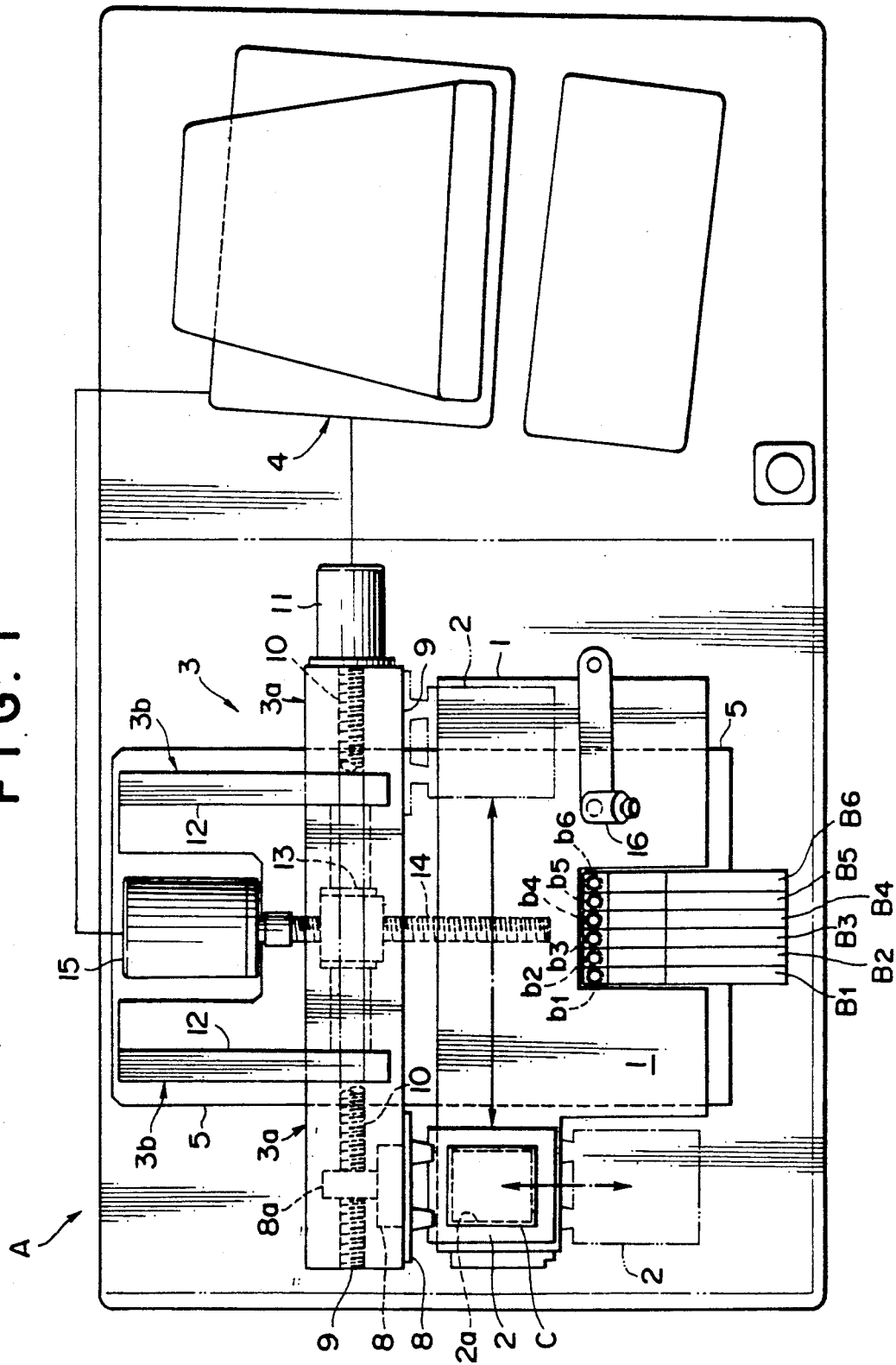
FIG. 1 is a top plan view of a punching device formed in accordance with the present invention.
Figure 2:
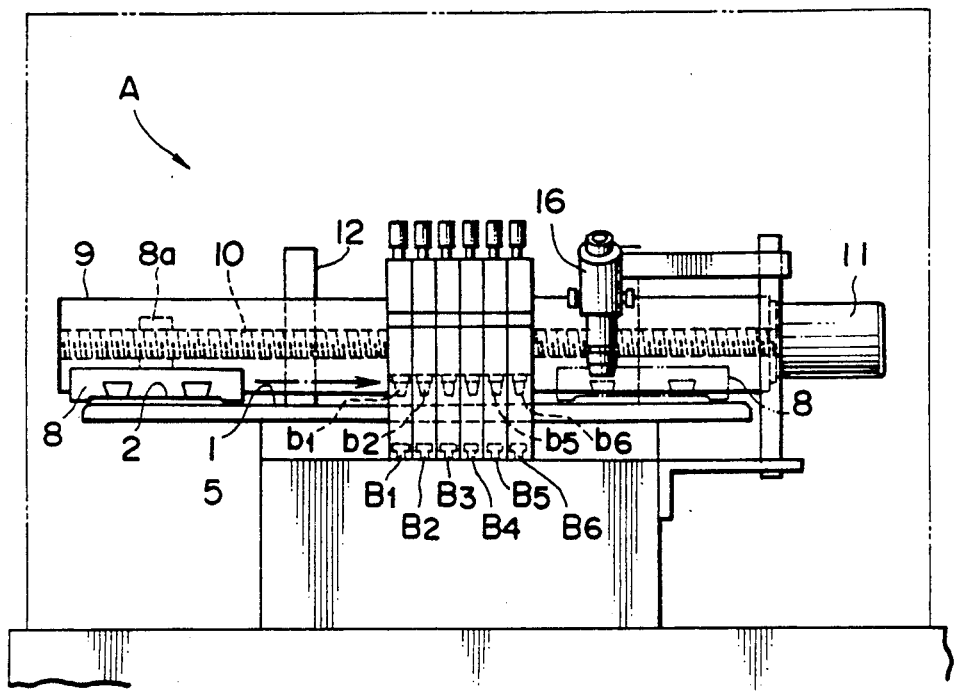
FIG. 2 is a front elevational view of the punching device of FIG. 1.
Figure 3:
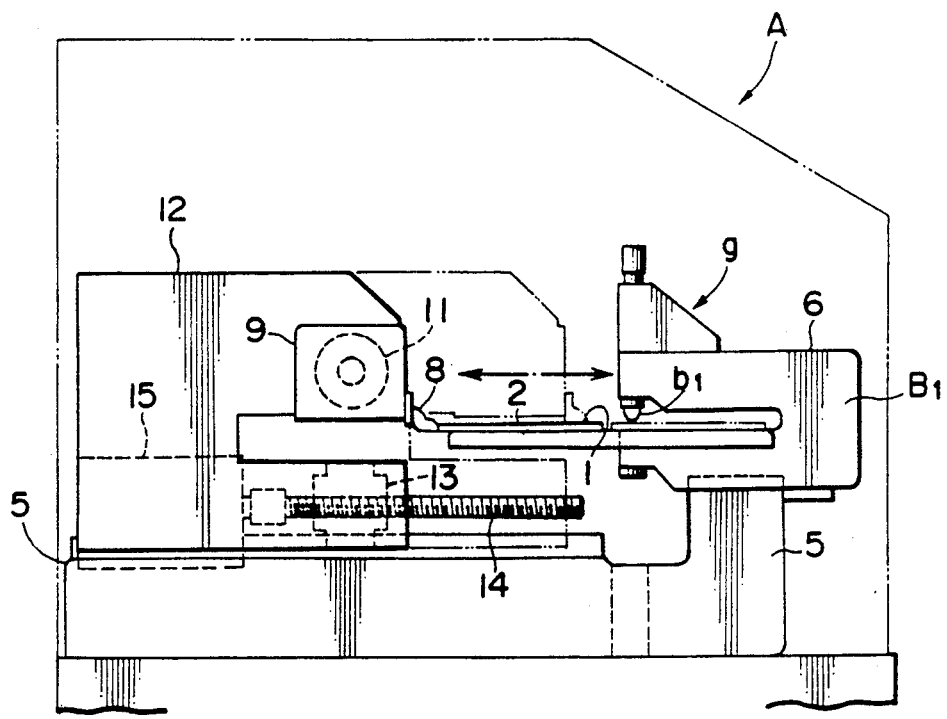
FIG. 3 is a side elevational view of the punching device of FIG. 1.
Figure 6:
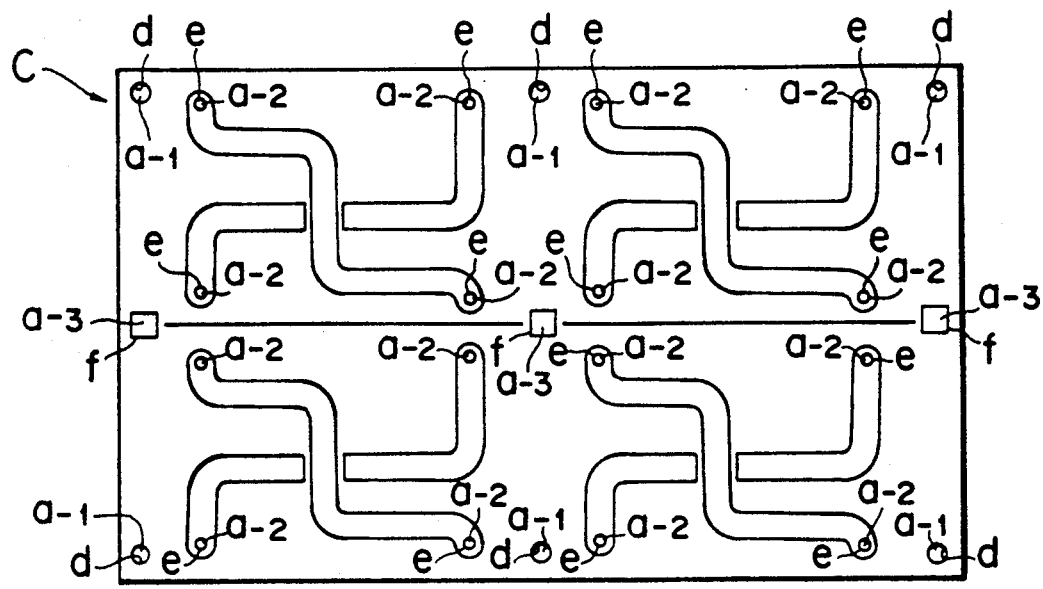
FIG. 6 is a top plan view illustrating a circuit board to be punched.

Referring now more specifically to the drawings, one preferred embodiment of each of the first and second main portions of the present inventions herein will be described in greater detail than above. As shown in FIGS. 1-3, a punching device A is illustrated in which the first portion of the present invention is applied. In this apparatus, a plurality of holes c, which can either be round, rectangular, or ovular, are to be punched in a plurality of desired positions in thin plate-like material, e.g., circuit board C, a flexible film or a metallic foil, as illustrated in FIG. 6.

Punching device A comprises a plurality of punching units $B_1$–$B_6$, as seen in FIGS. 1 and 2, which are arranged in a side-by-side fashion on a working table 1. The device further comprises a plurality of moving mechanisms or assemblies 3 for supporting one or more holder frames 2 which retain a workpiece, e.g., a flat, thin circuit board C, and for moving the holder frames on the working table 1 along both X-axis and Y-axis directions. The device further comprises a control assembly 4 for controlling operation of each of the moving mechanisms 3 and each of punching units $B_1$ through $B_6$. The control unit or assembly 4 can take a variety of forms, e.g., a CPU in the form of a microprocessor.

Each of the component elements, with the exception of control unit 4, is mounted on a base table 5, with a working table 1 fixedly positioned on base table 5. Additionally, punching units $B_1$–$B_6$, formed in accordance with a second portion of the invention, as described hereinafter, are fixed.

Figure 5:
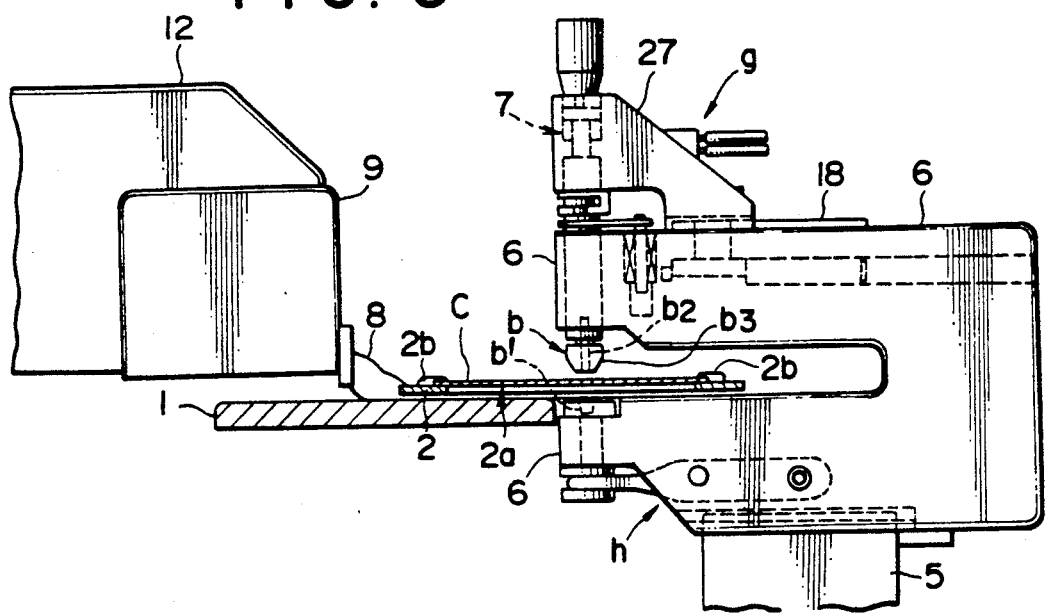
FIG. 5 is a longitudinal cross-sectional view illustrating a punching unit in more detail.

As illustrated in FIG. 5, punching units $B_1$–$B_6$ are provided at the upper and lower ends of a -shaped support rod or element 6, in the form of punches b and dies b'. The punch and die in each punch and die pair have shapes which are complementary to each other, such that each one of punches b is lowered by lifting piston assembly 7 in order to punch holes c having the same configuration as each of punches b in a circuit board C which is held between punches b and dies b'. Each of punching units $B_1$–$B_6$ is positioned in an overlapped or abutting relationship with an adjacent punching unit, in a side-by-side fashion, with axial cores of punches $b_1$–$b_6$ being installed within the units such that they are arranged in a row, along the X-axis direction, over a central portion of workpiece table 1.

Circuit board C, which is to be punched by punching units $B_1$ through $B_6$, is mounted on holder frame 2, having a window therein, so as to cover an opening 2a in frame 2; the board is held on holder frame 2 by having its circumference held by claws or grips 2b.

Holder frame 2 is, in turn, clamped by clamp 8 of moving mechanism 3, and is supported horizontally on working table 1. Moving mechanism 3 comprises a lateral feeding table or mechanism 3a for feeding or moving clamp 8 along an X-axis direction and a vertical feeding table or mechanism (3b) for supporting the lateral feeding table 3a and for feeding/moving the lateral table in a generally Y-axis direction.

Lateral feeding table 3a supports clamp 8 along a main body 9 of the table, and is moveable along an X-axis direction in such a way that it can be slid, and so that a threaded member 8a which is positioned on a rear surface of clamp 8 will be threadably fitted onto an X-axis thread 10 which is rotatably supported within main table body 9. The X-axis thread 10 can thereafter be rotated in both normal/forward and reverse directions by an X-axis motor 11 which is attached to one end of main table body 9.

Vertical feeding table 3b is provided with slide plates 12, 12 which are mounted on base plate 5 and which are supported in such a way that they can be slid along the Y-axis direction of the apparatus. Lateral feeding table 3a is supported by both slide plates 12, 12, and at the same time, Y-axis threaded member 14, supported within base plate 5, is threadably engaged within a threaded hole 13 formed at the central portion of the lateral feeding table 3a, along the Y-axis, in order to extend through the hole 13. The Y-axis threaded member is rotatably supported in both normal/forward and reverse directions by a Y-axis motor 15 which is attached to base table 5. Both motors 11 and 15 are controlled by control unit 4.

In this manner, holding frame 2, which holds circuit board C, will slide clamp 8, which clamps holder frame 2, along an X-axis direction of a main table body 9, under the rotation of X-axis motor 11. Further, main table body 9 can be moved in a Y-axis direction by Y-axis motor 15. In this fashion, the holding frame, and board C, can be moved along working table 1 in both X-axis and Y-axis directions.

Each of the above-noted punching units $B_1$-$B_6$, X-axis motor 11, and Y-axis motor 15 of moving assembly 3, is cooperatively connected to control unit 4.

Control unit 4 can control the operation of each of punching units $B_1$-$B_6$, as well as starting and stoppage of each of X-axis motor 11 and Y-axis motor 15 for moving assemblies 3, in response to data relating to the inputted punching position and hole shapes of the punches $b_1$-$b_6$. The data representing the punching positions are obtained, e.g., by a microscope 16 which is installed in a position along an extended line of the punches $b_1$-$b_6$ which are arranged side-by-side along working table 1, which position is offset along the X-axis direction of table 1.

In order to input the punching position(s) and the shape(s) of the hole(s) to be punched, circuit board C is moved along the X-axis direction and the Y-axis direction in order to cause each of the punching positions of circuit board C to be inputted while it is aligned, in sequence, with a center of the offset microscope 16. Simultaneously, the punched shape of the holes to be made at each of such punching positions is also selected, i.e., each of punching units $B_1$-$B_6$, which are provided with respective punches $b_1$-$b_6$ for punching out the holes, are selected to perform successive punching operations of various shapes.

Control unit 4 will have previously stored a program for use in calculating the distance of movement which is required, along both the X and Y axes, for sequentially moving the board C so that each of the punching positions inputted at the center of microscope 16, as described above, will be moved to the locations immediately below punches $b_1$-$b_6$, in order to have the punches form punched holes having desired shapes. Desired punching positions on the board are obtained sequentially, by moving the circuit board or other workpiece into a position just below the desired punches $b_1$-$b_6$, in response to the calculations made as noted above; thereafter, punching units $B_1$-$B_6$, which are provided with punches $b_1$-$b_6$, are operated, i.e., when the respective punching positions are reached immediately below desired punches $b_1$-$b_6$.

Control unit 4 also stores data, in advance, which relates to punching positions and punched hole shapes for a plurality of different types of known circuit boards C which are to be punched. In this fashion, a program for a circuit board C to be targeted can be selected to perform punching operations in accordance with the program.

Thereafter, inputting of punching positions and the shapes of punches $b_1$-$b_6$, and the action of each of the punching units during punching operations occurs as will be described with respect to the example of circuit board C which is illustrated in FIG. 6.

Figure 4:
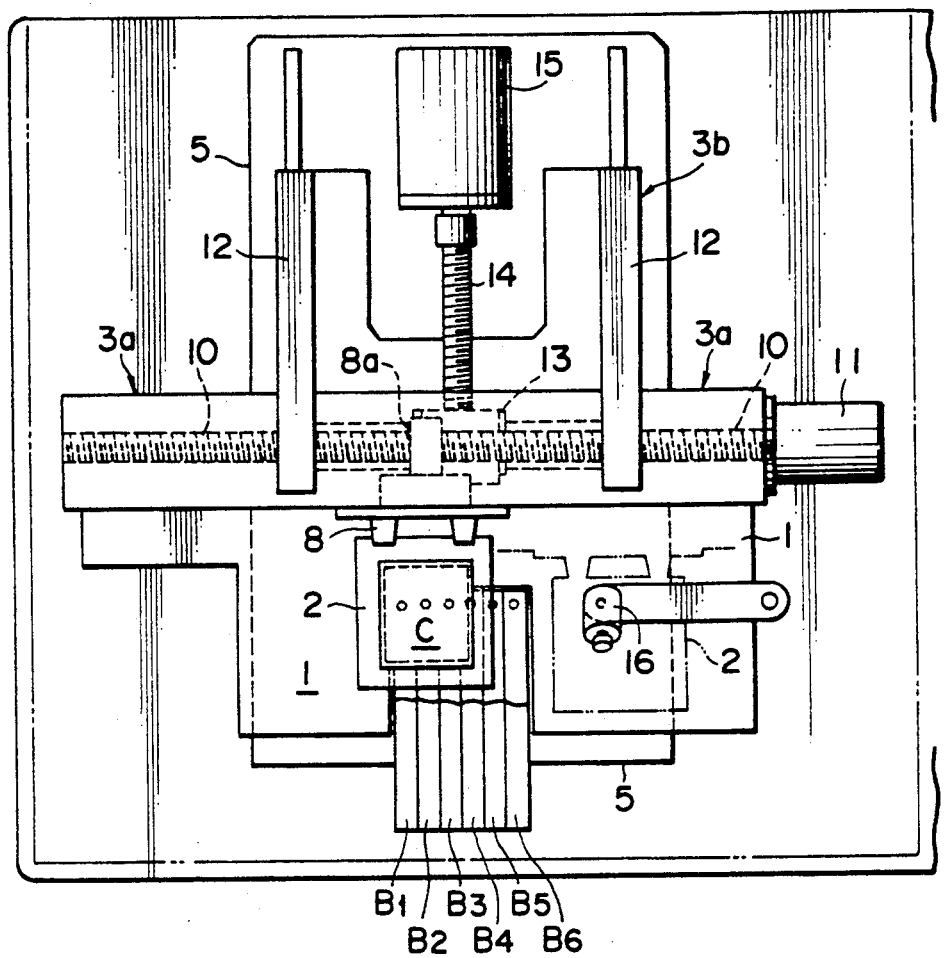
FIG. 4 is a top plan view illustrating the working table of the punching device, with a portion partially cut or broken away.

Initially, after circuit board C is accurately installed on holder frame 2, moving mechanisms 3 are manually operated (through appropriate manual controls which are not illustrated) in order to move punched positions (a-1) of indicated round holes d below the offset microscope 16, while circuit board C is being slid along working table 1 in both the X- and Y-axis directions, as illustrated in FIG. 4. Thereafter, the moving mechanisms will be finely moved while observing through the offset microscope 16, with punched hole position a-1 being accurately aligned with the center of microscope 16. In this condition, the punched hole position a-1 is inputted into control unit 4.

After punched hole positions a-2 through a-3 are then inputted to unit 4 in the same manner as punched hole position a-1, punching unit $B_1$, provided with punch $b_1$ for round hole d, is inputted as the punching unit for punching a plurality of round holes d. Thereafter, each of punched hole positions a-2 and a-3, for small round holes e and rectangular holes f, and punching units $B_2$ and $B_3$ for punching holes a-2 and a-3, will similarly be inputted In order to effect a punching operation, circuit board C, before performing a punching operation, will be installed within holder frame 2. Thereafter, a program having the above-noted data inputted therein will be initiated by control member 4.

In this fashion, for this example, moving mechanisms 3 will be controlled by control unit 4 in order to slide circuit board C along working table 1 by a desired distance in both the X- and Y-axis directions, in order to move punched hole position a-1 to a location immediately below round hole punch $b_1$ of punching unit $B_1$. Immediately thereafter, control unit 4 will operate lifting piston 7 of punching unit $B_1$ and lower round hole punch $b_1$. As this round hole punch is lowered, punched hole position a-1 of circuit board C, which is positioned on die $b_1$, will be punched out by round hole punch $b_1$.

Subsequently, each of the punched hole positions a-1 will be moved sequentially into a location just below the above-noted round hole punch $b_1$, while circuit board C is slid so as to punch a plurality of round holes d with this punch.

Thereafter, each punched hole position a-2 is moved to a location just below small hole punch $b_2$ of punching unit $B_2$, while circuit board C is being slid in a desired direction in order to punch a first small round hole e; thereafter, punching hole positions a-3 are moved to a location just below rectangular hole punch $b_3$ of punching unit $B_3$ in order to punch a rectangular hole f, and thereafter all of the operating steps are completed.

Subsequent to these operations on circuit board C, in situations in which another punching operation is to be effected for another circuit board, the program for such additional circuit board is subsequently inputted into the control unit 4, and is called up as described above. Thereafter, a punching operation is effected in accordance with the additional program.

In order to move the punching hole position of the circuit board into a position just below the desired punches, both X-axis motor 11 and Y-axis motor 15 can be operated simultaneously to cause the desired punching hole position to be slid obliquely, i.e., the frame 8 and retained circuit board will move at an angle. Further, the motors can be moved linearly with respect to the punching operation or moved while the punching hole position is being separately slid along the X- and Y-axis directions.

The punching unit B, forming a second portion of the present invention, and which is used in punching device A, will now be described with specific reference to FIGS. 7-12.

Figure 8:
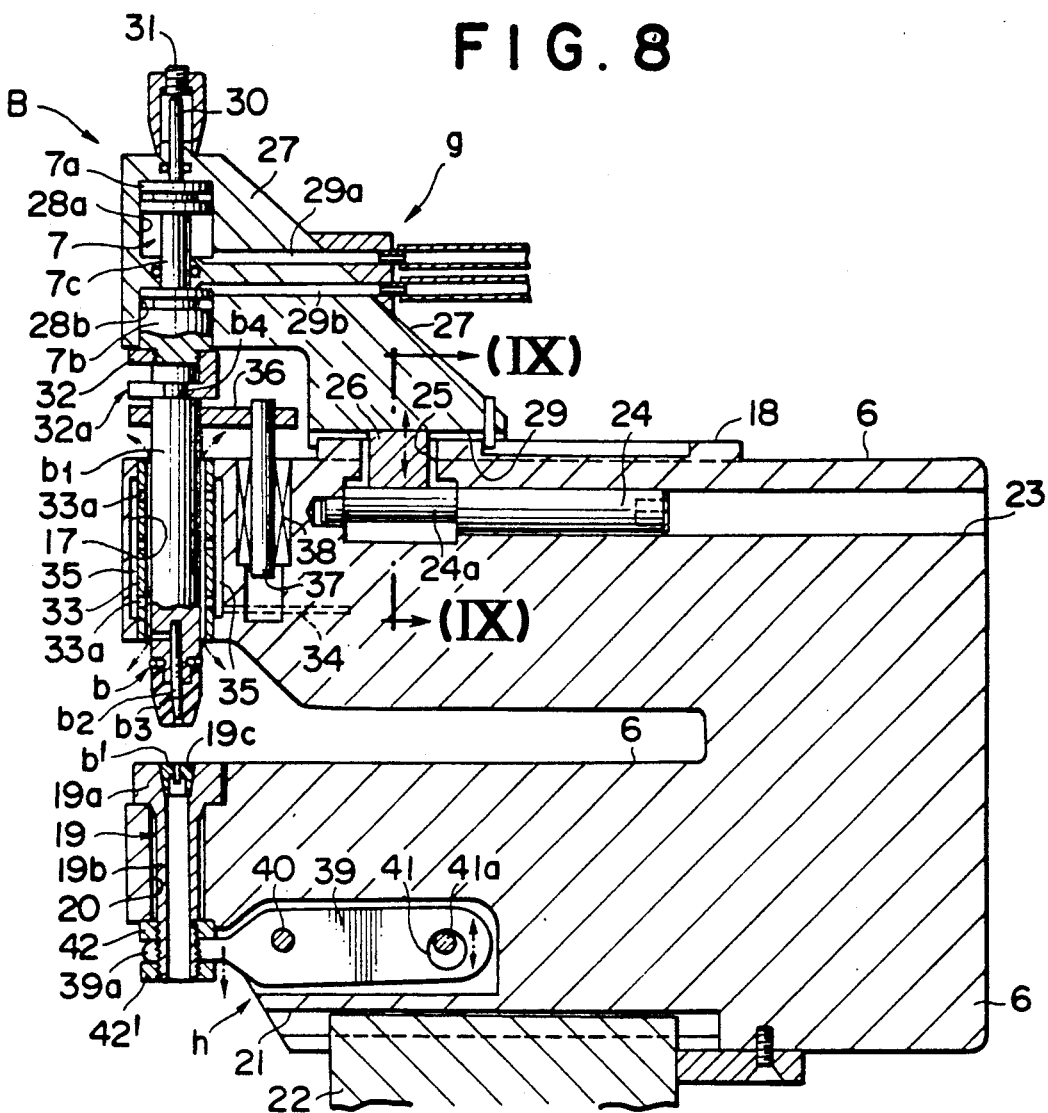
FIG. 8 is a longitudinal cross-sectional view illustrating the punching unit of FIG. 7.

Punching unit B, as shown in FIG. 8, includes a lifting mechanism g provided with a lifting piston 7 at the upper side of a substantially -shaped supporting member 6; simultaneously, a punch (b), which is to be raised or lowered by lifting piston 7, is fitted within fitting hole 17 in the upper side section or portion of the supporting member 6; and (female) die b', which corresponds in shape to the extreme (lower) end of punch b, is fixed to the lower section of supporting member 6.

Supporting member 6 comprises a steel plate of a desired thickness which is formed into a substantially -configuration, and has a dovetail-shaped portion 18, with lifting mechanism g fitted on the dovetailed portion The mechanism g includes a lower recess or grooved portion 29 (see FIG. 12) which can be slidably mounted on member 18.

Punch (b) is pushed through (i.e., punched) the upper surface of support member 6 in such a way that it can be moved through the insertion fixing hole 17 and insertion hole 20, for inserting holder 19 for die b', is formed at a location immediately below fixing hole 17 on the lower portion of supporting rod 6 so that the die will receive the punch.

A generally T-configured groove 21 is formed along the lower (under) side of supporting member 6; and groove 21 is fitted to a fixing rail 22 having a T-shaped section which is arranged on base table 5 of punching hole device A in order to cause supporting rod 6 to be detachably fixed, in a desired position, on base table 5. In this manner, assembly 7 can be removed from member 6 when desired.

Figure 9:
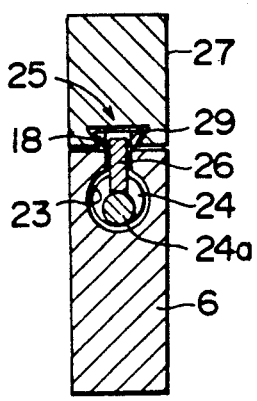
FIGS. 9 and 10 are sectional views taken along line IX—IX of FIG. 8, with FIG. 10 showing both locked (solid) and open (dashed) positions, and FIG. 9 illustrating an unlocked position of the apparatus.
Figure 10:
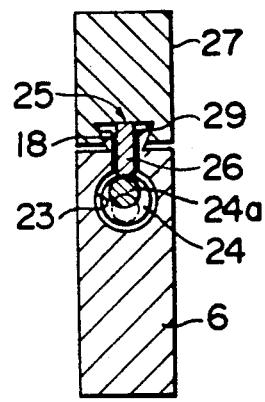
Figure 11:
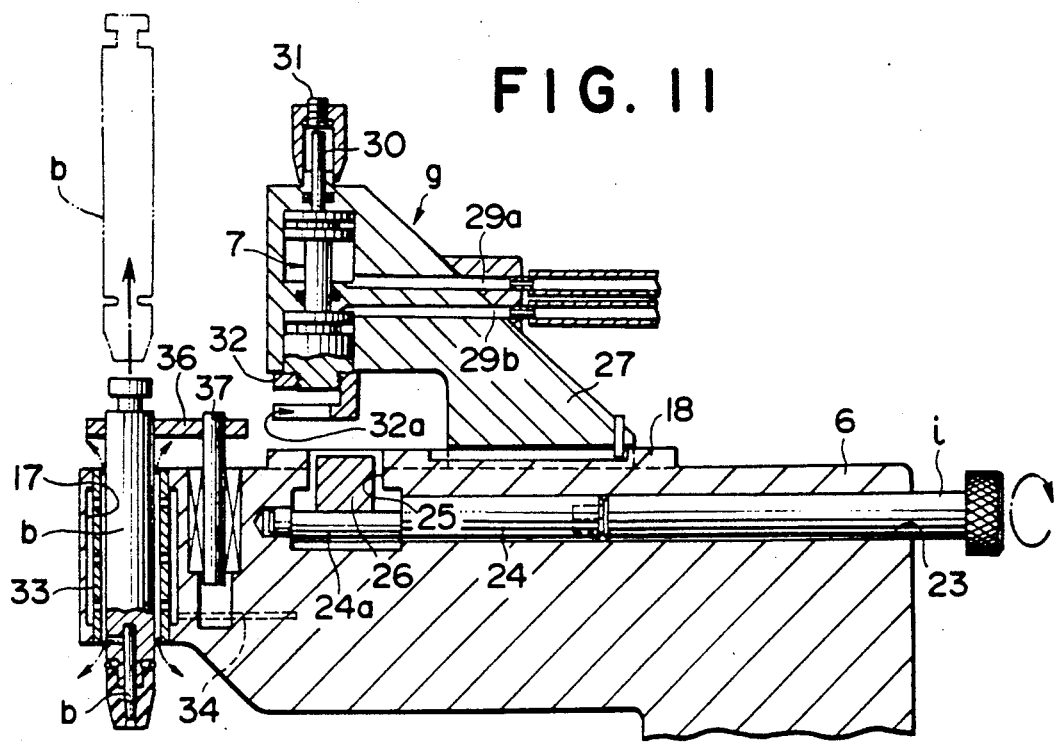
FIG. 11 is a longitudinal cross-sectional view illustrating the upper half portion of a supporting member in a position in which its lifting mechanism has been retracted.

A longitudinal hole or bore 23 is formed in member 6 at a location just below dovetail-shaped portion 18 of supporting member 6; and a cam shaft 24 is fitted into longitudinal hole 23. Simultaneously, a locking piece 26 is inserted into an opening 25 on the upper surface of the dovetailed portion 18, and is mounted on a cam portion 24a of cam shaft 24, as illustrated in FIG. 9. Further, as illustrated in FIG. 11, cam shaft 24 can be rotated by a tool (i) such that locking piece 26 will be pushed upwardly with cam portion 24a, and thereafter will project upwardly from opening 25 on the upper surface of dovetail 18 This will lock the assembly g on member 6, as shown in FIG. 10.

Lifting mechanism g, which is to be mounted along the upper side of supporting member 6, is constructed by positioning lifting piston 7 into main body 27 of the lifting mechanism. A dovetail-shaped groove 29 is formed at the bottom surface of main body 27, with the groove being fitted within dovetail portion 18 along the upper side of the noted supporting rod 6. In this fashion, main body 27 can be slidably moved from a desired, fixed position rearwardly, or from a rearward position to the fixed position. When main body 27 of the lifting mechanism is positioned at its fixed position, cam shaft 24 will be rotated in order to force locking piece 26 to be pushed upwardly. In this fashion, main body 27 will be locked at the position illustrated in FIG. 10; and the cam shaft can then be rotated in an opposite direction in order to lower lock piece 24 so as to release the lock piece, as illustrated in FIG. 9.

At a location immediately above punch b of main body 27 of the lifting mechanism, a lifting piston assembly 7 is vertically installed. This lifting piston assembly comprises an upper lifting piston 7a and a lowering piston 7b with a shaft 7c, each of pistons 7a and 7b being fitted into separate cylinders 28a and 28b, respectively Compressed air is supplied to or discharged through a plurality of supply and discharge holes 29a and 29b which are in fluidic communication with both cylinders 28a and 28b, in order to respectively raise or lower lifting piston assembly 7. The cylinders can alternatively be hydraulically actuated in a conventional fashion.

Lifting piston assembly 7 is provided with a stop pin 30, which projects outwardly from the upper portion of cylinder 28a, with the extreme end of stop pin 30 abutting against adjusting screw 31, the screw being rotatable in order to adjust the lifting position of lifting piston 7.

Figure 12:
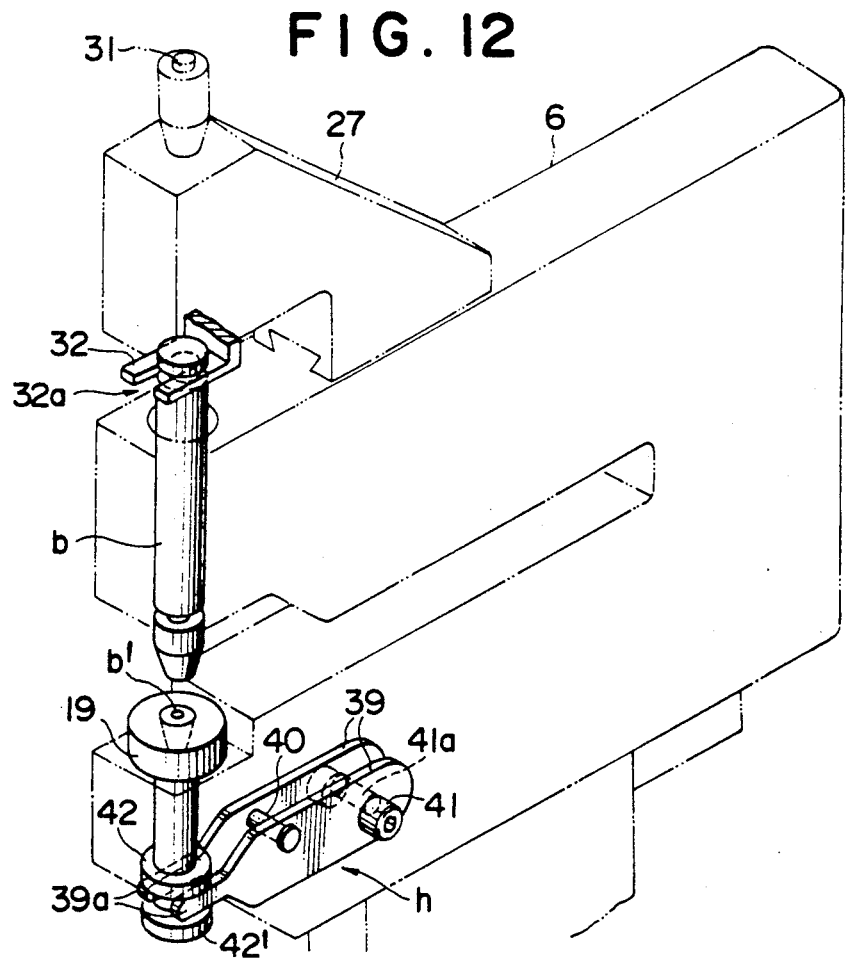
FIG. 12 is a perspective view illustrating a punch and die used in the apparatus of FIG. 7.

In turn, an internally threaded connecting fitting piece 32 is attached to the lower surface of descending piston 7b, as illustrated in FIGS. 11 and 12. Connecting fitting piece 32 is formed by bending a steel plate into a substantially -shape, with a forked end 32a being formed at one extreme end of the fitting attachment; piece 32 is threadably attached to the lower surface of the same piston rod 7b.

Within fixing hole 17, which is formed directly below the lifting piston rod 7b, a cylindrical bearing 33 is positioned having a desired number of injecting holes 33a located on its circumferential surface. Simultaneously, an axial punch b is fitted within bearing 33 with a desired clearance being left between the outer punch surface and the inner bearing surface. Compressed air to be supplied from a compressor pump, not shown in the drawings, is supplied into clearance 35, within the circumferential surface inside bearing 33, through air supply passage 34.

Compressed air which is supplied to the clearance 35 is injected into the clearance between outer circumferential surface of punch b and the inner circumferential surface of bearing 33, through each of injection holes 33a, and is thereafter discharged from both ends of bearing 33.

Thereafter, punch b is supported by a film of compressed air which is generated in the clearance between the outer circumferential surface of the punch and the inner circumferential surface of bearing 33, and is supported in such a way that it can either be lifted or lowered.

Figure 7:
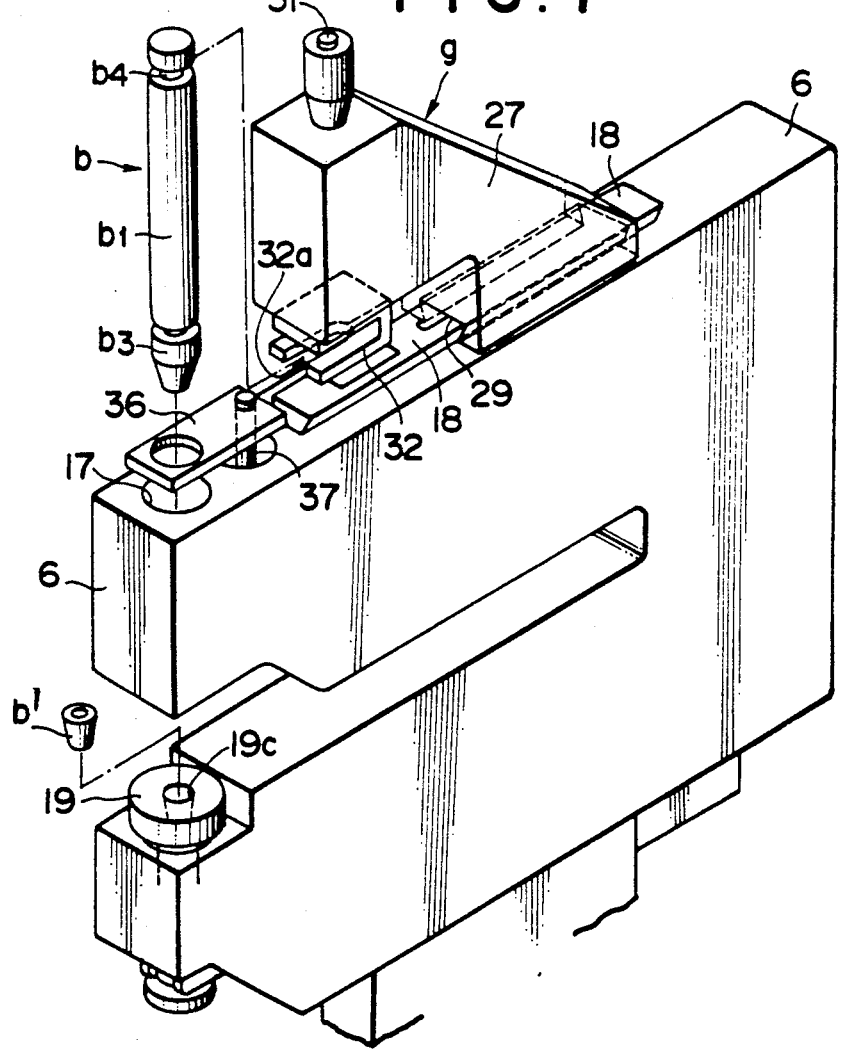
FIG. 7 is a perspective view illustrating a punching unit which can be used in the punching device of the present invention.

Punch b is constructed, as seen in FIGS. 7 and 8, so that a push cutting blade $b_2$ for punching cut a target hole at the extreme end of the axial punch main body $b_1$ will be removably fit therein; further, a silicon rubber pusher member $b_3$ is fitted to cover the circumference of push cutting blade $b_2$, and a fitting groove $b_4$ is formed at the circumferential surface of punch b, at the end opposite from the punching end.

One end of a connector plate 36 is then removably fitted to a rear (i.e., top) end of punch b, and, further, a guide shaft 37 is fitted to the other end of connector plate 36 in order to hold punch b and guide shaft 37 in a generally horizontally spaced condition. Guide shaft 37 is, in turn, fitted and inserted into a slide bearing 38 fitted to a side portion of fixing hole 17. In this fashion, punch b is guided by guide shaft 37, and is thereafter raised or lowered along the center of bearing 33.

In order to connect the rear end of punch b, which is fitted within bearing 33, to the lower surface of lowering piston 7b, fitting groove $b_4$ at the rear end of punch b is fitted into and engaged within the forked end 32a of connecting fitting piece 32, which is threadably engaged with lowering piston 7b when the retracted lifting mechanism g is being slid towards its attaching position. Thereafter, connecting fitting piece 32 is rotated along its fastening direction and is fastened until the end portion of punch b is pushed against the lowest surface of descending piston 7b. When punch b has a shape other than a round shape, it is connected while the angular position of the punch b, in its circumferential direction, is adjusted. When punch b is connected to lowering piston 7b, cam shaft 24 is rotated by tool (i) in order to lock lifting mechanism g in its fixed position. During replacement or maintenance of punch b, the above-noted lock is released, and connecting fitting piece 32 is loosened. Thereafter, lifting mechanism g is retracted and punch b is pulled upwardly, as shown in FIG. 11.

Die b', corresponding to punch b, is fitted within die installation hole 19c of base plate 19a of holder 19 as illustrated in FIG. 7, in such a way that it can be either fitted or removed from the hole. Tubular portion 19b of holder 19 is fitted into insertion hole 20, at the lower end of supporting rod 6, in order to fit die b' below punch b. The tubular portion 19b of holder 19 is formed so as to have a diameter which is slightly smaller than the diameter of the insertion hole, and is constructed so that it can be slid in its diametrical direction. In this fashion, holder 19 can be slid upwardly into a position in which the push cutting blade $b_2$ of punch b is accurately fitted to die b' when punching is effected. Holder 19 is positioned in a locked position against supporting member 6 by a locking mechanism h which is described hereinafter.

Locking mechanism h is internally installed in a space formed at the lower side of supporting member 6. Two arm plates 39, 39 (of which one is shown in FIG. 8), are pivotably supported by a supporting shaft 40, with the extreme end of arm plates 39, 39 being mitered to a fine shape in order to form an engagement portion 39a; simultaneously, cam portion 41a of cam shaft 41 is fitted to the rear ends of arm plates 39, 39, and both ends of cam shaft 41 are supported by the main body of supporting element 6. Engagement member 39a is inserted into the space between stopping threads 42 and 42', which are threadably fitted to the lower end of tubular portion 19b of holder 19. Cam shaft 41 is rotated in order to cause the engagement portion 39a to pull tubular member 19b downwardly, and base plate 19a is pushed against the tubular member around insertion hole 20 of supporting element 6. Consequently, the tubular member is locked against movement.

When a die b' has a hole other than a round hole, and is attached to holder 19, the die is aligned in a position so as to adjust its circumferential angular position; and, thereafter, it is locked.

FIG. 5 illustrates a condition in which a punching unit B, constructed as noted above, is mounted within base plate 5. Circuit board C, which is subjected to punching action, is then installed in holder frame 2 and held on die b'; the punching position is then set at a location directly below punch b.

Thereafter, punch b is lowered, and the punching hole of circuit board C is punched out with push cutter blade $b_2$ of punch b. At such time, since circuit toward C is pushed onto die b' by pushing member $b_3$, which is located at the extreme end of punch b, it will not vibrate when it is punched outwardly by push cutter blade $b_2$. Accordingly, a clear/clean hole can be punched out at an accurate position The above-noted punching unit B facilitates attachment and removal of punches b and dies b'. Simultaneously, punching unit B can itself be attached vertically on base table 5 of punching device A and can be removed therefrom. In this fashion, replacement of each punching unit B with a new unit, or changing the position of the punching unit, can be facilitated, and maintenance thereof can be smoothly achieved.

Setting the position and adjusting the angle of dies b' can also be easily and accurately performed.

The punching unit B can be used in conventional types of punching devices as well as in the punching assembly of the present invention.

It is clear from the above that other embodiments, features, modifications and objects of the present invention can be performed which are equivalent to the present structure, and which will be within the scope of the claims in this application.

What is claimed is:

1. A device for punching a thin plate-like workpiece, said device comprising a plurality of punching units arranged in a side-by-side fashion on a working table, each of said punching units having a punch and a die of a predetermined shape, a lifting mechanism including a lifting piston attached on a support member, wherein said punch is detachably mounted in a fixing hole in said support member below said lifting piston, means for detachably connecting one end of said punch to said lifting piston, and means for lifting and lowering said punch in a predetermined direction, said lifting mechanism being adapted to horizontally slide on said support member in a direction perpendicular to said predetermined direction, said device further comprising a moving assembly for movably supporting at least one frame which is adapted to hold said thin plate-like workpiece, said moving assembly comprising means for moving said frame in both X-axis and Y-axis directions along a surface of said working table, said device further comprising a control unit for inputting a punching position and a punching shape data, and for controlling operation of said moving assembly and said punching units in response to said data, said controlling unit further comprising means for moving a workpiece into desired punching positions below said punching units.

2. A punching device according to claim 1, wherein said support member is generally -shaped having an upper and a lower surface.

3. A punching device according to claim 1, wherein said lifting mechanism is slidably mounted on said upper surface of said support member.

4. A punching device according to claim 1, wherein said punch is vertically movable and removable from said fixing hole in said in said upper surface of said support member.

5. A punching device according to claim 1, wherein said punch comprises a rear end and a front end, further wherein said punching device is provided with a means for detachably connecting said rear end of said punch with said lifting assembly.

6. A punching device according to claim 1, wherein said punch has a corresponding die having a complementary shape to said punch shape, said die being removably positioned below said punch in said lower surface of said support member.

7. A punching unit adapted for use in a punching device having a lifting assembly, said lifting assembly including a movably positioned lifting position attached to one side of a subtantially -shaped supporting member, said supporting member comprising at least one attaching hole and a punch detachably fitted within each of said at least one attaching hole, said unit further comprising means for lifting and lowering said punch in a predetermined direction, said lifting assembly being horizontally movable on said support member perpendicular to said predetermined direction, said punch including a front end and a rear end, said punch rear end being detachably connected to said lifting piston, said punching unit further including a die located below each of said at least one attaching hole, corresponding to said punch, said die being detachably positioned within a lower portion of said supporting member.

8. A punching device for punching at least one hole in a thin, substantially flat workpiece, said punching device comprising:
(a) a substantially horizontal working table upon which a workpiece to be punched is adapted to be movably positioned;
(b) at least one holder frame for movably holding said workpiece on an upper surface of said table;
(c) a moving assembly for moving each of said at least one holder frame in both an X-axis direction and a Y-axis direction along an upper surface of said table;
(d) at least one punching unit for punching holes in said workpiece, each of said at least one punching unit comprising:
 (i) a generally -shaped support member having an upper surface and a lower surface;
 (ii) a punch lifting assembly substantially horizontally movably positioned on said upper surface of said support member;
 (iii) a punch of a predetermined shape movably positioned perpendicular to said punch lifting assembly movement, within an attachment hole in an upper portion of said support member, said punch having a front end and a rear end;
 (iv) means for detachably connecting said rear end of said punch to said lifting assembly; and
 (v) a die having a shape complementary to said punch shape, said die being removably positioned within a lower portion of said support member; and
(e) a control unit for inputting data representative of desired punching locations on said workpiece and of the shape of each punch to be made, said control unit comprising means for controlling the operation of said moving assembly and said punching unit in response to any data which is input.

9. A punching device in accordance with claim 8, wherein said control unit further comprises means for controlling movement of said assembly to position said workpiece at a plurality of predetermined positions which are to be punched, each of said at least one punching unit comprising means for punching said workpiece at each of said predetermined positions.

10. A punching device in accordance with claim 8, wherein said working table is substantially flat and is positioned in a horizontal fashion on a base table.

11. A punching device in accordance with claim 8, wherein each of said at least one frame has a window, wherein said workpiece, when positioned in said at least one holder frame, is visible through said window.

12. A punching device in accordance with claim 8, wherein each of said at least one frame includes at least one clamp for detachably retaining a workpiece within said at least one frame.

13. A punching device in accordance with claim 8, wherein said moving assembly comprises a lateral feeding mechanism for moving each of said at least one frame in a substantially X-axis direction along said upper table surface and a longitudinal feeding mechanism for supporting said lateral feeding mechanism and for moving said lateral feeding mechanism in a substantially Y-axis direction along said upper table surface.

14. A punching device in accordance with claim 13, wherein said lateral feeding mechanism includes a threaded rotatable screw which is driven by a first motor, said screw being positioned within a threaded aperture in a clamping member which engages said at least one frame.

15. A punching device in accordance with claim 14, wherein said longitudinal feeding mechanism comprises a threaded screw which is driven by a second motor, and a plurality of clamps which engage an outer surface of said lateral feeding mechanism.

16. A punching device in accordance with claim 15, wherein both of said motors are controlled by said control unit, said control unit comprising a microprocessor.

17. A punching device in accordance with claim 8, further comprising a microscope aligned with, and offset from, each said punching unit, said microscope comprising means for determining positions on said workpiece which are to be punched.

18. A punching unit adapted to be used with a punching device for punching a plurality of holes of predetermined shapes in a workpiece, said punching unit comprising:
(a) a generally -shaped support member having an upper surface and a lower surface;
(b) a punch lifting assembly detachably positioned so as to be horizontally movable on said upper surface of said support member;

(c) a punch of a predetermined shape movably positioned, perpendicular to said punch lifting assembly movement, within an attachment hole in an upper portion of said support member, said punch having a front end and a rear end;

(d) means for detachably connecting said rear end of said punch to said lifting assembly; and (e) a die having a shape complimentary to said punch shape, said die being removably positioned within a lower portion of said support member.

19. A punching unit in accordance with claim 18, wherein said support member comprises a steel plate having a predetermined thickness.

20. A punching unit in accordance with claim 19, further comprising a dovetail-shaped fastening member positioned on an upper surface of said support member, said fastening member being fitted within a groove on a lower surface of said lifting assembly.

21. A punching unit in accordance with claim 18, said support member further comprising a substantially longitudinal bore, said punching unit further comprising a cam shaft fitted within said longitudinal bore and a locking element movably positioned in said bore, said locking element being moveable into a locked position in which it protrudes through an opening in said fastening member and extends into said groove.

22. A punching unit in accordance with claim 18, wherein said punch lifting assembly includes a punch lifting piston assembly which is connected to said upper surface of said support member and which comprises means for raising and lowering said punch within said attachment hole.

23. A punching unit in accordance with claim 22, said lifting piston assembly comprising a lifting piston, a lowering piston, and a shaft connecting said two pistons each of said pistons being fitted into a separate cylinder.

24. A punching unit in accordance with claim 23, further comprising means for selectively supplying compressed air to, and removing compressed air from, said cylinders.

25. A punching unit in accordance with claim 24, wherein said attachment hole has a substantially cylindrical bearing fitted therein, and wherein said punch is fitted within said bearing such that a predetermined clearance is located between said punch and said bearing.

26. A punching unit in accordance with claim 25, further comprising means for supplying compressed air to said clearance.

27. A punching unit in accordance with claim 22, further comprising a connector plate attached to said rear end of said punch, and a guide shaft positioned in a bore in said supporting member, said guide shaft having one end engaged by said connector plate, said connector plate thereby comprising means for maintaining said punch and said guide shaft in a substantially horizontally spaced position 28. A punching unit in accordance with claim 18, further comprising a locking mechanism for maintaining said die within a bore in said lower portion of said support member.

29. A punching unit in accordance with claim 28, wherein said locking mechanism comprises two arm plates pivotably supported by a support shaft which detachably supports said die, each of said arm plates having a first end which is adapted to engage a rotatable cam shaft.

30. A punching device for punching at least one hole in a thin, substantially flat workpiece, said punching device comprising:

(a) a substantially horizontal working table upon which a workpiece to be punched is adapted to be movably positioned;

(b) at least one holder frame for movably holding said workpiece on an upper surface of said table;

(c) a moving assembly for moving each of said at least one holder frames in both an X-axis direction and a Y-axis direction along an upper surface of said table;

(d) punching units for punching holes in said workpiece, wherein said punching units are adjacently aligned on said work table, each of said punching units comprising a punch and a die of a predetermined shape, wherein the punches of each of said punching units have different shapes, further wherein each of said punching units generally comprises a -shaped support member having an upper and a lower portion, wherein said punch is fitted in said upper portion of said support member and a die is fitted in said lower portion of said support member, said upper portion of said support member being further provided with a means for slidably attaching a lifting mechanism which operates said punch, said lifting mechanism being horizontally slidable perpendicular to a direction in which said punch is fitted in said upper portion of said support member; and (e) a control unit for inputting data representative of desired punching locations on said workpiece and of the shape of each punch to be made, said control unit comprising means for controlling the operation of said moving assembly and said punching units in response to any data which is input.

31. A punching device in accordance with claim 30, wherein the punches in said punching units are aligned in a substantially linear fashion.

* * * * *